United States Patent
Mehringer

(10) Patent No.: US 9,823,309 B2
(45) Date of Patent: Nov. 21, 2017

(54) METHOD FOR DETECTING AN ELECTRICAL FAULT IN A GENERATOR ASSEMBLAGE, AND MEANS FOR IMPLEMENTATION THEREOF

(71) Applicant: Robert Bosch GmbH, Stuttgart (DE)

(72) Inventor: Paul Mehringer, Stuttgart (DE)

(73) Assignee: Robert Rosch GmbH, Stuttgart (DE)

( * ) Notice: Subject to any disclaimer, the term of this patent is extended or adjusted under 35 U.S.C. 154(b) by 541 days.

(21) Appl. No.: 14/157,702

(22) Filed: Jan. 17, 2014

(65) Prior Publication Data

US 2014/0197842 A1    Jul. 17, 2014

(30) Foreign Application Priority Data

Jan. 17, 2013   (DE) .......................... 10 2013 200 637

(51) Int. Cl.
  *G01R 31/02*   (2006.01)
  *G01R 31/34*   (2006.01)
  *G01R 31/00*   (2006.01)

(52) U.S. Cl.
  CPC .......... *G01R 31/343* (2013.01); *G01R 31/005* (2013.01)

(58) Field of Classification Search
  CPC ...... G01R 31/343; G01R 31/34; G01R 19/22; G01R 31/346; G01R 19/2513
  USPC .......... 324/530, 765.01, 604, 772, 416, 500, 324/512, 555, 87, 119, 388, 546
  See application file for complete search history.

(56) References Cited

U.S. PATENT DOCUMENTS

| | | | |
|---|---|---|---|
| 4,973,902 A | 11/1990 | Dhyanchand et al. | |
| 5,126,677 A * | 6/1992 | Campbell | H04B 1/126 324/511 |
| 5,565,753 A * | 10/1996 | Chen | H02P 27/02 318/809 |
| 8,054,016 B2 * | 11/2011 | Gottemoller | H02P 23/14 318/143 |
| 2002/0176266 A1 * | 11/2002 | Perreault | B60L 3/003 363/53 |
| 2003/0067794 A1 * | 4/2003 | Boylan | H02M 3/33592 363/127 |

(Continued)

FOREIGN PATENT DOCUMENTS

| | | |
|---|---|---|
| CH | 579 845 | 9/1976 |
| DE | 25 51 683 | 6/1977 |

(Continued)

*Primary Examiner* — Jermele M Hollington
*Assistant Examiner* — Taqi Nasir
(74) *Attorney, Agent, or Firm* — Norton Rose Fulbright US LLP; Gerard Messina

(57) ABSTRACT

A method for identifying electrical faults in a generator assemblage, in particular of a motor vehicle, which assemblage includes a generator having a generator regulator and a rectifier having rectifier elements, the method encompassing ascertaining, in the context of at least one excitation current value of an excitation current through an excitation winding of the generator, at least one respective parameter that corresponds to a current conduction time proportion of at least one of the rectifier elements, and determining that an electrical fault exists if the at least one parameter deviates by more than a predetermined amount from an associated expected value. Also described is an apparatus for implementing the method.

12 Claims, 8 Drawing Sheets

(56) References Cited

U.S. PATENT DOCUMENTS

2006/0221525 A1\* 10/2006 Konishi ............... H02J 7/1461
  361/93.1
2010/0066294 A1\* 3/2010 Hendrickson ......... B60L 3/0023
  318/490
2010/0301816 A1\* 12/2010 Akita ...................... H02P 9/10
  322/34

FOREIGN PATENT DOCUMENTS

| DE | 10 2004 028 213 | 12/2005 | | |
|----|----|----|----|----|
| JP | 08 65914 | 3/1996 | | |
| JP | 08-065914 A1 * | 8/1996 | ............... | H02J 7/24 |
| JP | 337 4543 | 11/2002 | | |

\* cited by examiner

METHOD FOR DETECTING AN ELECTRICAL FAULT IN A GENERATOR ASSEMBLAGE, AND MEANS FOR IMPLEMENTATION THEREOF

RELATED APPLICATION INFORMATION

The present application claims priority to and the benefit of German patent application no. 10 2013 200 637.3, which was filed in Germany on Jan. 17, 2013, the disclosure of which is incorporated herein by reference.

FIELD OF THE INVENTION

The present invention relates to a method for detecting an electrical fault in a generator assemblage, and to an arrangement for implementation thereof.

BACKGROUND INFORMATION

Generator assemblages for motor vehicles typically have an externally excited generator having an excitation winding and a stator winding, a rectifier downstream from the stator winding, and a generator regulator. The generator regulator regulates the voltage generated by the generator by correspondingly adjusting the current through the excitation winding. The generator is often embodied as a claw pole generator. The invention is not limited to use in motor vehicles, however, but can also be utilized in generator assemblages in aircraft and/or watercraft.

The electrical systems of corresponding vehicles encompass at least one generator assemblage, at least one battery, and a plurality of electrical loads. As safety-relevant electrical systems in vehicles become increasingly widespread—for example, the electronic stability program and the like in motor vehicles—protection of the vehicle's electrical system becomes increasingly significant. Protection from overvoltages is particularly important in this context.

Overvoltages can result in particular from electrical faults in the generator assemblage, for example inter-turn short circuits in the stator field, inter-turn short circuits in the excitation winding, changes in the magnetic properties of the electrical machine (for example, as a result of demagnetization of permanent magnets installed therein), short circuits in the rectifier, or faults that influence the no-load voltage of the generator assemblage. "Electrical faults" are understood in the context of this Application as all faults that can influence the voltage introduced into the connected vehicle electrical system by way of the generator assemblage.

As indicated in JP 3374543 B2, voltages present on the DC voltage side and AC voltage side of a rectifier of the generator assemblage can be compared with one another in comparator-based fashion in order to detect electrical faults. The method recited allows a short circuit in the rectifier to be detected, but detection of errors within the generator, for example of inter-turn short circuits in the stator winding or excitation winding thereof, is not possible.

A need therefore continues to exist for improved capabilities for detecting electrical faults in corresponding generator assemblages.

SUMMARY OF THE INVENTION

In light of the above, the present Application proposes a method for detecting an electrical fault in a generator assemblage, and an arrangement for implementation thereof, having the features of the independent claims. Exemplary embodiments are the subject matter of the dependent claims and of the description that follows.

As explained, with known methods in which voltages applied on the DC voltage side and AC voltage side of a rectifier of the generator assemblage are compared with one another in comparator-based fashion it is not possible, for example, to detect inter-turn short circuits in the stator winding and/or excitation winding of the generator. The present invention overcomes this disadvantage. It permits detection of all of the previously mentioned electrical faults in the generator assemblage, for example inter-turn short circuits in the stator field, inter-turn short circuits in the excitation winding, changes in the magnetic properties of the electrical machine, short circuits in the rectifier, and faults that influence no-load voltage.

The invention is employed in a generator assemblage, in particular a generator assemblage of a motor vehicle. As mentioned, a generator assemblage of this kind has a generator having a generator regulator, and a rectifier having rectifier elements.

Corresponding rectifiers are known in principle. The rectifier elements in rectifiers can be embodied as classic diodes or as Zener diodes. A conventional six-pulse rectifier for rectifying a three-phase rotary current, for example, has six rectifier elements. A rectifier element can also, for example, have a diode pair connected in parallel, or several diodes connected in parallel. The invention can also be employed, however, in active rectifiers in which the rectifier elements are embodied as semiconductor switches, for example as metal oxide semiconductor field effect transistors. Generator assemblages having active rectifiers can enable motor-mode operation of the generator, the rectifier being used for commutation.

As mentioned, the generator regulator regulates the output voltage of the generator by corresponding energization of the excitation coil, for example by pulse-width-modulated application of control to a corresponding semiconductor switch. The method according to the present invention encompasses ascertaining, in the context of at least one excitation current value of an excitation current through the excitation winding of the generator, at least one parameter that corresponds to a current conduction time proportion of at least one of the rectifier elements.

In the context of this Application, the term "current conduction time proportion" refers to that proportion of a time period during which a current is flowing through a corresponding rectifier element. The current in a diode flows when a voltage gradient corresponding to the forward current is present.

According to the present invention, if the at least one parameter deviates from an associated expected value by more than a predetermined amount, it is determined that an electrical fault exists. The "expected value" refers here to the respective excitation current value and, advantageously, also to a specific generator rotation speed and a vehicle electrical system voltage. Expected values can be derived, for example, e.g. by way of a characteristic curve, from a known relationship between the excitation current values and the parameters resulting therefrom in the context of intact generators. This characteristic curve usefully refers to a constant generator rotation speed, and takes into account the vehicle electrical system voltage.

The invention can proceed, for example, from a method in which a voltage present at (at least) one DC-voltage-side terminal of the rectifier and a voltage present at (at least) one AC-voltage-side terminal of the rectifier are evaluated in comparator-based fashion.

The "DC-voltage-side terminals" of the rectifier are understood as those two terminals of the rectifier which supply a DC voltage and introduce it into the connected vehicle electrical system. The designations usually used for the DC-voltage-side terminals or battery poles, in accordance with their polarity, are respectively B+ and B− or G+ and G−. One of the DC-voltage-side terminals, typically the negative one in continental European vehicles, can be grounded. In this case the positive DC-voltage-side terminal is at a potential that corresponds to the vehicle electrical system voltage, for example 12 V, and the negative DC-voltage-side terminal is at 0 V.

Correspondingly, the AC-voltage-side terminals of the rectifier are those terminals at which the rectifier is connected to the generator. The AC-voltage-side terminals are also referred to as "phases." They can be, for example, three or five in number. The invention can, however, also be employed in the context of four-, six-, seven-, or multi-phase generator assemblages. An alternating current made available by the generator is introduced via the AC-voltage-side terminals into the rectifier, which converts it into a direct current.

Each of the AC-voltage-side terminals is connected in the rectifier via a first rectifier element to the first DC-voltage-side terminal and via a second rectifier element to the second DC-voltage-side terminal. The rectifier elements are interconnected in such a way that a current can respectively flow either only in a first direction from the corresponding AC-voltage-side terminal via the first semiconductor switch to the first (positive) DC-voltage-side terminal, or only in a second direction from the second (negative) DC-voltage-side terminal via the second semiconductor switch to the corresponding AC-voltage-side terminal.

The invention exploits the fact that in the context of maximum excitation of a generator of an intact generator assemblage, a current is almost always flowing, specifically almost 50% of the time in the first direction and almost 50% of the time in the second direction. The current conduction time proportion of the first rectifier element and the current conduction time proportion of the second rectifier element therefore each equal almost 50%. As explained below, in a generator assemblage having electrical faults these current conduction time proportions cannot be reached even at maximum excitation. They therefore remain appreciably below the aforesaid 50%, as is also the case with a partially excited generator.

With an intact generator assemblage, the excitation current (which is an indication of the degree of excitation of the electrical machine) thus has a known relationship to the current conduction time proportion of each of the rectifier elements. With an intact generator assemblage, for each excitation current there is therefore a corresponding expected value for a parameter that is correlated with the current conduction time proportion of at least one rectifier element. This is true at least for respectively constant rotation speeds and vehicle electrical system voltages. Deviations from this known relationship occur when electrical faults exist in the generator assemblage. It is precisely this that the invention exploits.

The invention derives the parameter, for example, from the comparator-based comparison that has been explained. This is possible because whenever current is flowing in the previously explained first direction from the corresponding AC-voltage-side terminal via the first semiconductor switch to the first (positive) AC-voltage-side terminal (i.e. from the generator through the rectifier into the vehicle electrical system, or out of the generator), the voltage present at the AC-voltage-side terminal of the rectifier is greater than the corresponding rectified voltage at its positive DC-voltage-side terminal. If these voltages are compared, for example using a correspondingly interconnected comparator, a comparator signal of one can thereby be obtained. In the other time periods the comparator signal is equal to zero. If what is obtained thereby is a comparator signal of one approximately 50% of the time, and a comparator signal of zero approximately 50% of the time, the current conduction time proportion of the first and of the second rectifier element is in each case almost 50%. In the context of a fully excited generator, this means that the generator assemblage exhibits no electrical faults.

The same is analogously true for the situation in which current is flowing in the previously explained second direction from the second (negative) DC-voltage-side terminal via the second semiconductor switch to the corresponding AC-voltage-side terminal (i.e. from the vehicle electrical system through the rectifier to the generator, or into the generator). The measured voltage present at the AC-voltage-side terminal of the rectifier is less than the corresponding voltage at its negative DC-voltage-side terminal (e.g. less than 0 V if said terminal is grounded). These voltages as well can, as explained above, be compared in comparator-based fashion.

A computation unit according to the present invention, for example a generator regulator or a corresponding control unit, constituting an arrangement for implementing, in particular in program-engineering fashion, the method according to the present invention, is set up to carry out a method according to the present invention.

Implementation of the method in the form of software is also advantageous, since this entails particularly low costs, especially if an executing control unit is also used for further tasks and is therefore present in any case. Suitable data media for making the computer program available are, in particular, diskettes, hard drives, flash memories, EEPROMs, CD-ROMs, DVDs, among many others. Downloading of a program via computer networks (internet, intranet, etc.) is also possible.

Further advantages and embodiments of the invention are evident from the description and the appended drawings.

It is understood that the features recited above and those yet to be explained below are usable not only in the respective combination indicated, but also in other combinations or in isolation, without departing from the scope of the present invention.

The present invention is depicted schematically in the drawings on the basis of an exemplifying embodiment, and will be described in detail with reference to the drawings.

DETAILED DESCRIPTION

Figure 1:
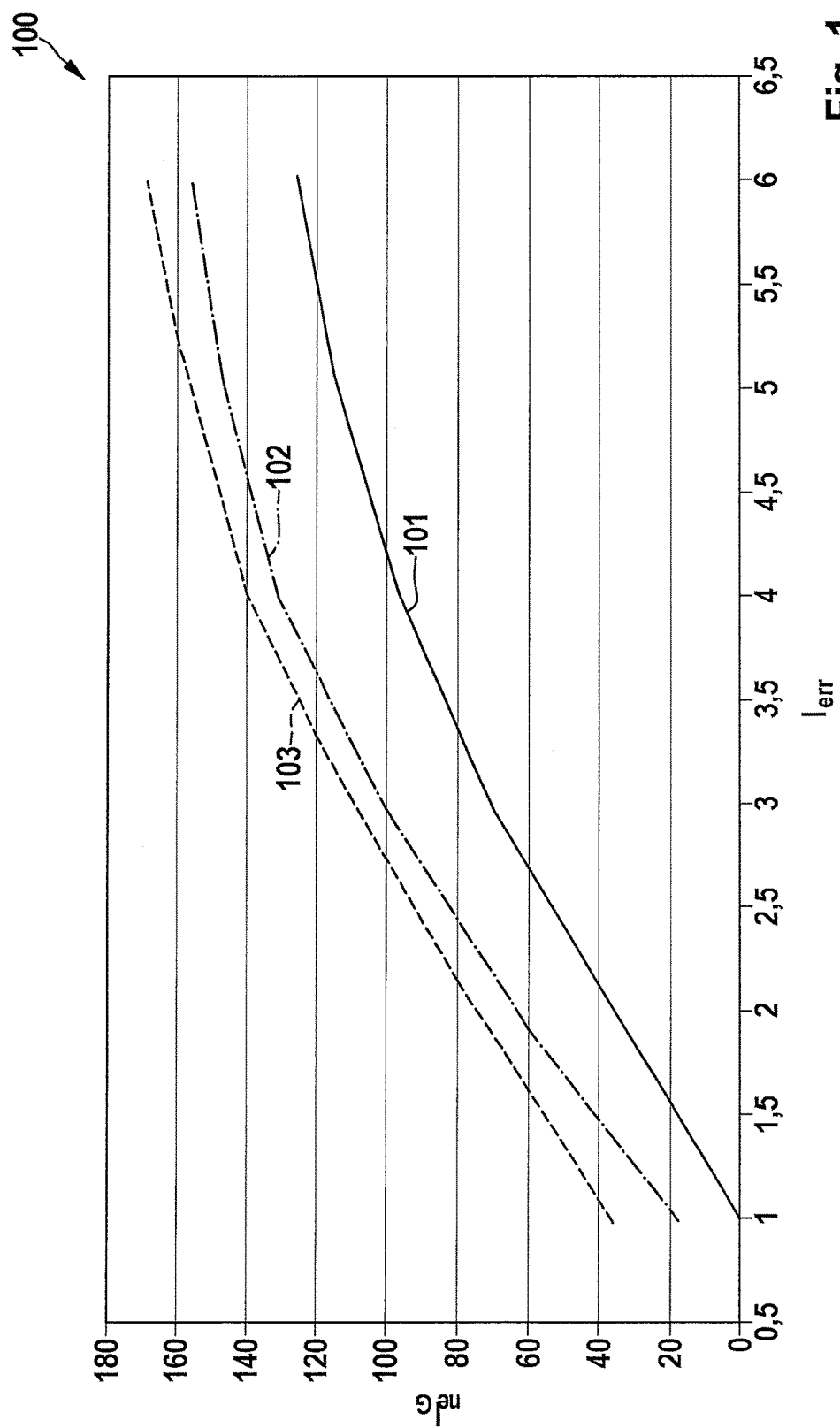
FIG. 1 shows a relationship between an excitation current and a generator current in the context of a generator assemblage.

In the Figures, elements corresponding to one another are indicated using identical reference characters; explanations are not repeated.

FIG. 1 shows, in a diagram 100, a relationship between an excitation current Ierr on the X axis and a generator current IGen on the Y axis (in A in each case), in the context of a generator of a generator assemblage at different rotation speeds, namely 1800 revolutions per minute (curve 101), 3000 revolutions per minute (curve 102), and 6000 revolutions per minute (curve 103). It is evident that, for example, at 1800 rpm (curve 101) current can be delivered only above a minimum excitation current of 1 A. The invention makes it possible to plausibilize even this so-called "approach current."

This can be done by ascertaining in the comparator apparatus described (which is illustrated in more detail in FIG. 3), for example in the context of implementation in a regulator, the excitation current above which the comparator signal is just greater than 0.

Figure 2:
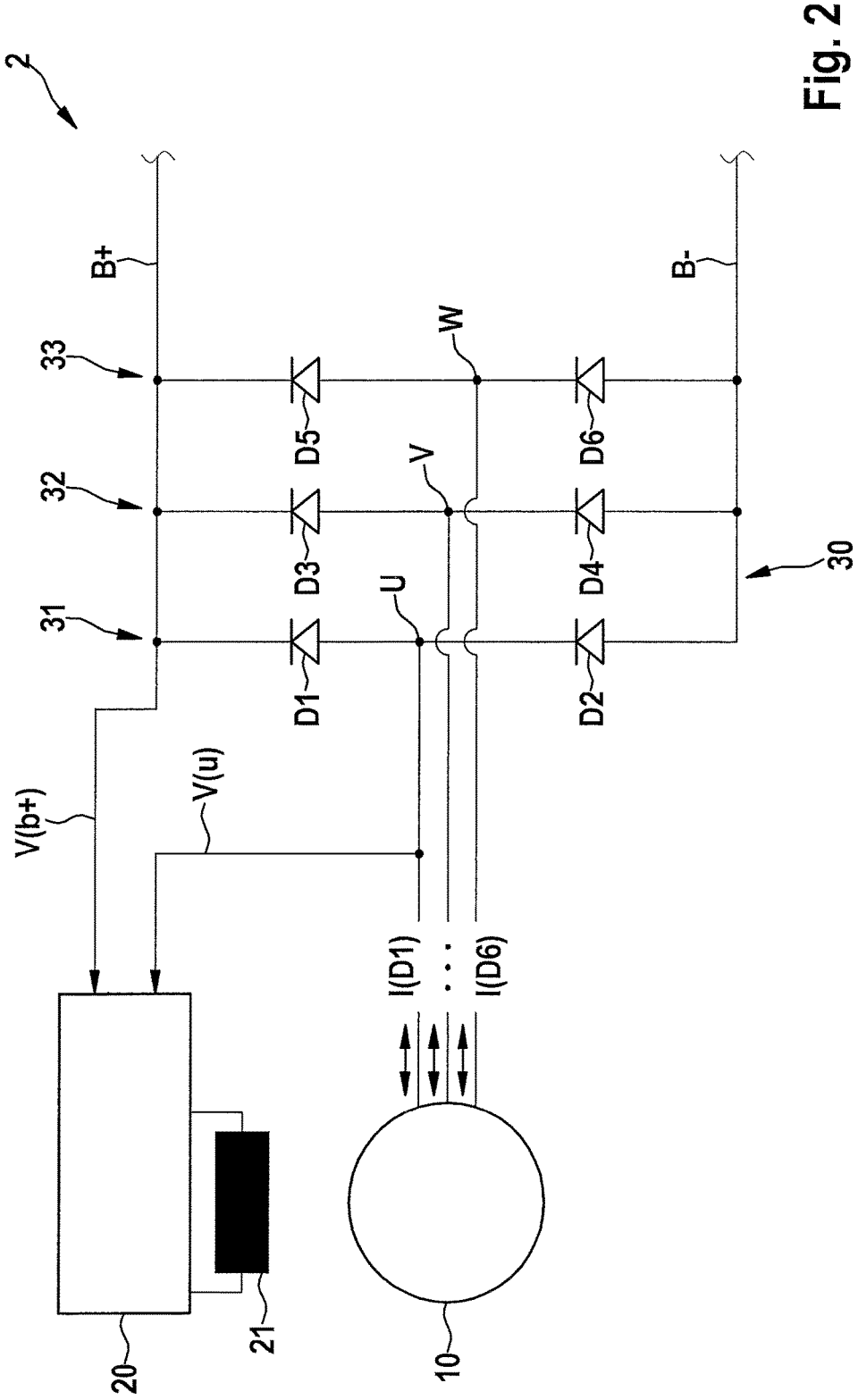
FIG. 2 schematically depicts a generator assemblage according to the existing art.

FIG. 2 schematically depicts a generator assemblage 2 according to the existing art. It encompasses the actual generator 10, a generator regulator 20 having an excitation winding 21, and a rectifier 30. Generator 10 is embodied with three phases, so that generator 10 and rectifier 30 have three AC-voltage-side terminals U, V, and W. The AC-voltage-side terminals U, V, and W are respectively connected to substantially identically constructed half bridges 31, 32, 33 of rectifier 30. The DC-voltage-side terminals of rectifier 30 are labeled B+ and B−.

Disposed in half bridges 31, 32, 33 of rectifier 30 are rectifier elements D1 to D6, respectively illustrated as diodes, that enable a current flow in the first or the second previously described direction. Corresponding current flows are indicated as I(D1) to I(D6). A negative sign indicates the first direction, from the corresponding AC-voltage-side terminal U, V, W via the labeled rectifier element D1, D3 or D5 to the first (positive) DC-voltage-side terminal B+ (i.e. from generator 10 through rectifier 30 into the vehicle electrical system, or out of generator 10); an indication with no sign indicates the second direction, from the second (negative) DC-voltage-side terminal B− via the labeled rectifier element D2, D4, D6 to the corresponding DC-voltage-side terminal U, V, W (i.e. from the vehicle electrical system through rectifier 30 to generator 10, or into generator 10).

Via correspondingly labeled leads, generator regulator 20 can evaluate the voltage, illustrated here as V(u), present at at least one AC-voltage-side terminal (here, U) of generator 10 or of rectifier 30. Generator regulator 20 can detect a generator rotation speed by way of its frequency. Generator regulator 20 can furthermore evaluate a DC voltage present, for example, at the positive DC voltage terminal B+. This voltage can serve as an input variable for regulating the excitation current through excitation winding 21 with generator regulator 20.

Figure 3:
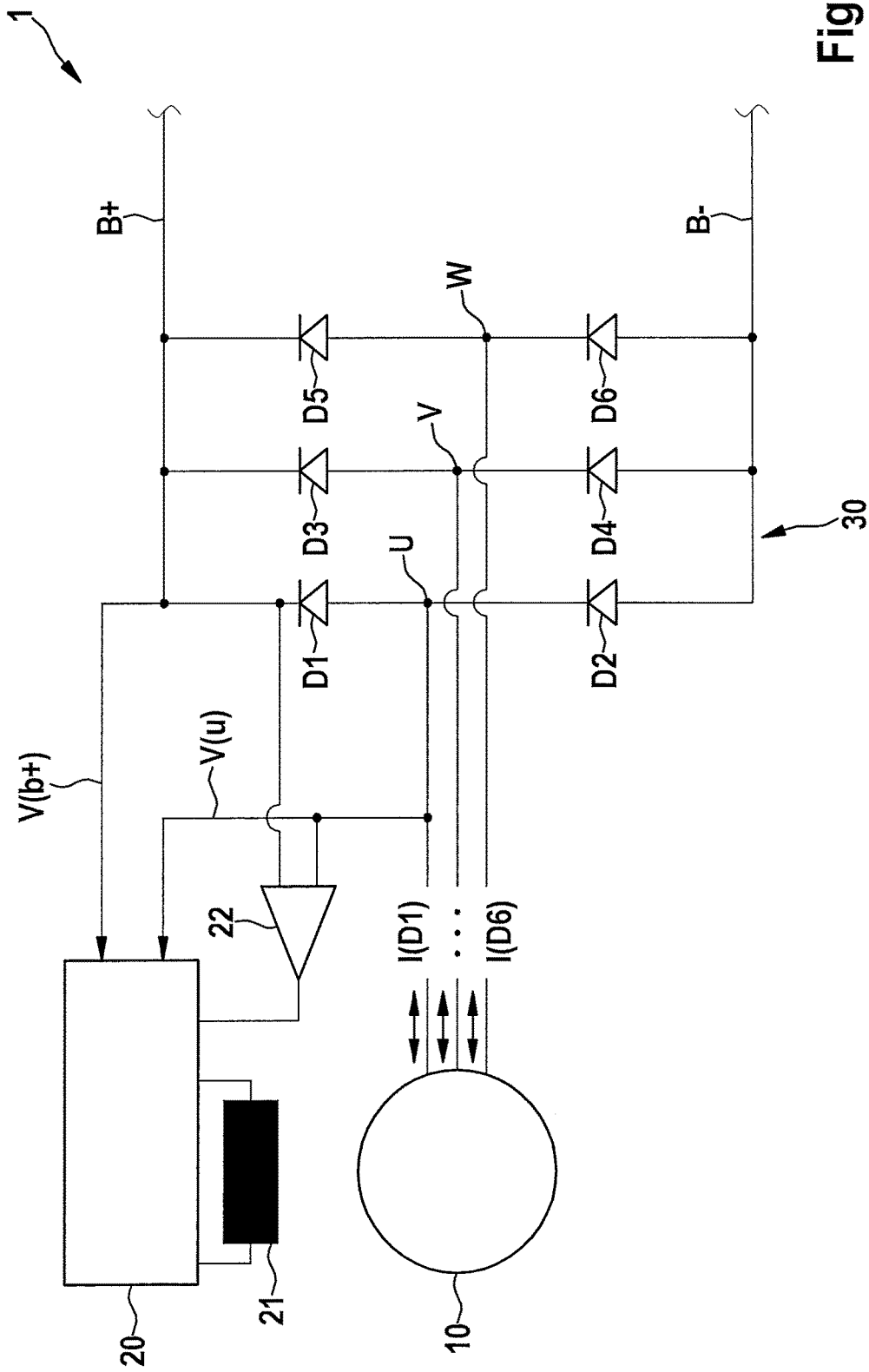
FIG. 3 schematically depicts a generator assemblage according to an embodiment of the invention.

FIG. 3 schematically depicts a generator assemblage 1 according to an embodiment of the invention. Generator assemblage 1 has the essential elements of the previously generator assemblage 2.

Also provided is a comparator 22 that is set up to compare in comparator-based fashion a voltage (here, V(u)) present at an AC-voltage-side terminal of generator 10 or of rectifier 30 and a DC voltage present at a DC voltage terminal (here, B+). Comparator 22, and evaluation circuits downstream from it, can be embodied as part of generator regulator 20 and can be integrated into a corresponding housing. The current conduction time proportion of the rectifier elements (here, of D1 and D2) connected to the respective AC-voltage-side terminal can be ascertained by way of an evaluation of the comparator signal.

Figure 4:
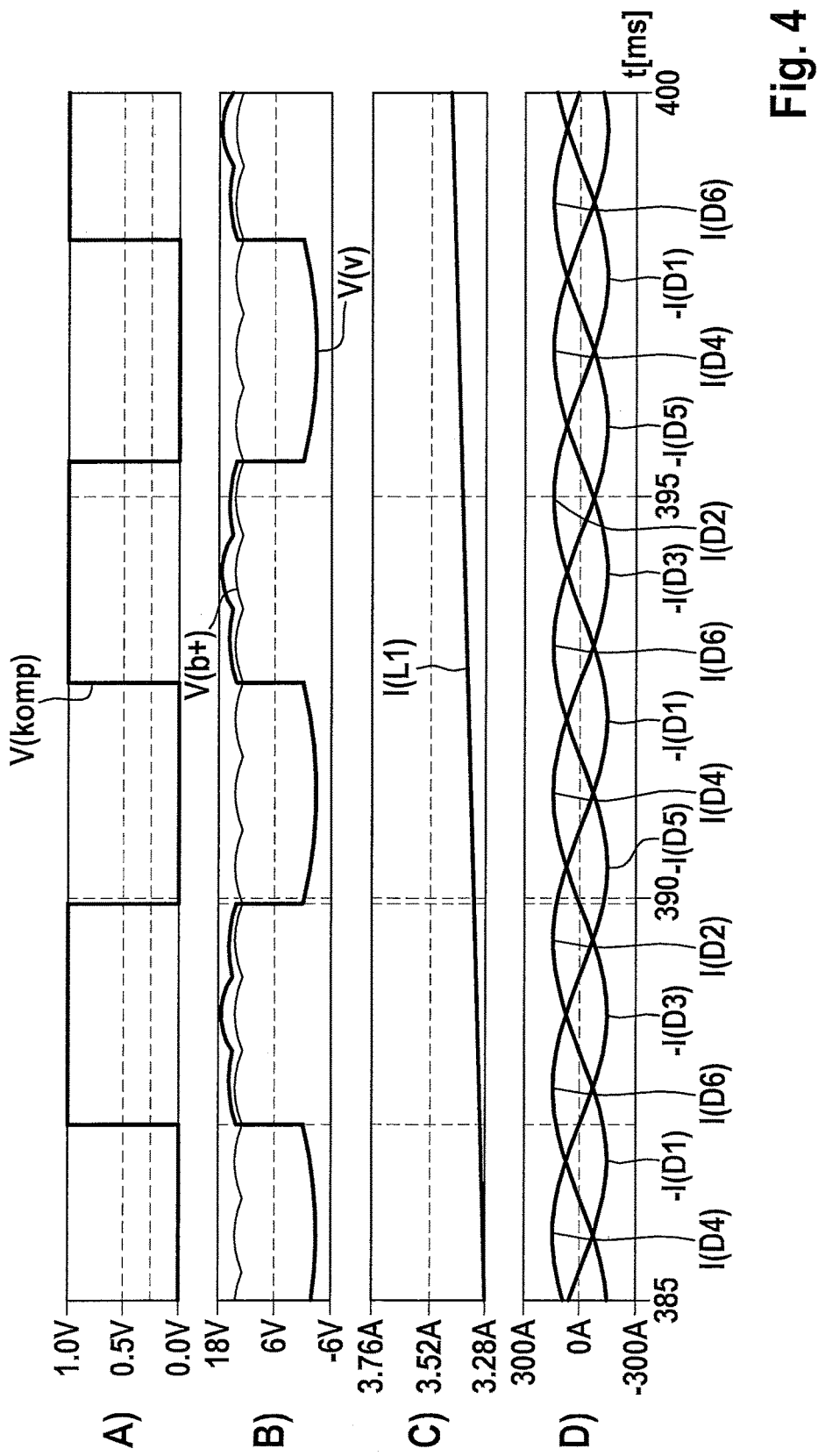
FIG. 4 shows signal profiles of currents and voltages in the context of a generator assemblage having a fully excited generator.

FIG. 4 depicts signal profiles of currents and voltages in the context of a generator assemblage having a fully energized generator, for example of generator assemblage 1 having generator 10. All the signal profiles are plotted with respect to a time t (in ms) on the X axis.

Diagram A shows a comparator signal V(komp) of comparator 22, in V. Diagram B shows a voltage (here, V(v)) present at an AC-voltage-side terminal of generator 10 or of rectifier 30, and a DC voltage present at a DC-voltage-side terminal (here, B+), in V. The signal correspond in principle to those (V(u) and B+) that can be evaluated in generator assemblage 1 as shown in FIG. 1. Diagram C shows a current I(L1) flowing through excitation winding 21, in A. Diagram D shows the currents −I(D1), I(D2), −I(D3), I(D4), −I(D5), and I(D6) flowing out of generator 10 via rectifier 30 and rectifier elements D1 to D6 into the vehicle electrical system or vice versa, in A (see the explanations of FIG. 2 regarding the signs). Each of these currents flows during a respective positive or negative half-wave of a sine-wave signal.

It is apparent from FIG. 4 that, for example, whenever a current −I(D3) is flowing out of generator 10 via rectifier element D3 into the vehicle electrical system (first direction explained above), the voltage V(v) present at the associated AC-voltage-side terminal becomes greater than the voltage present at the positive DC-voltage-side terminal B+. Comparator 22 thus responds, so that a corresponding value of a comparator signal V(komp) is obtained (diagram A). The voltage of the comparator signal V(komp) can be selected arbitrarily.

A corresponding situation would also prevail in the opposite direction when a current I(D4) is flowing through rectifier element D4 into generator 10 (second direction explained above). The measured voltage V(v) present at the associated AC-voltage-side terminal would then be less than the voltage present at the negative DC-voltage-side terminal B−. A correspondingly reversely configured comparator 22 would thus also respond here.

It is evident from FIG. 3 that the comparator signal V(komp) is at a value of 1 V for approximately 50% of the time. The reason for this is that the oppositely located rectifier elements (illustrated here at D3 and D4) convey current almost without a break. In addition, the voltage V(v) has rising and falling edges in the picosecond range.

Although rectifier elements D3 and D4 are elucidated in particular in FIG. 4, it is to be emphasized that the corresponding explanations also apply to the other rectifier elements and their currents and voltages. These, too, can therefore be correspondingly evaluated.

Figure 5:
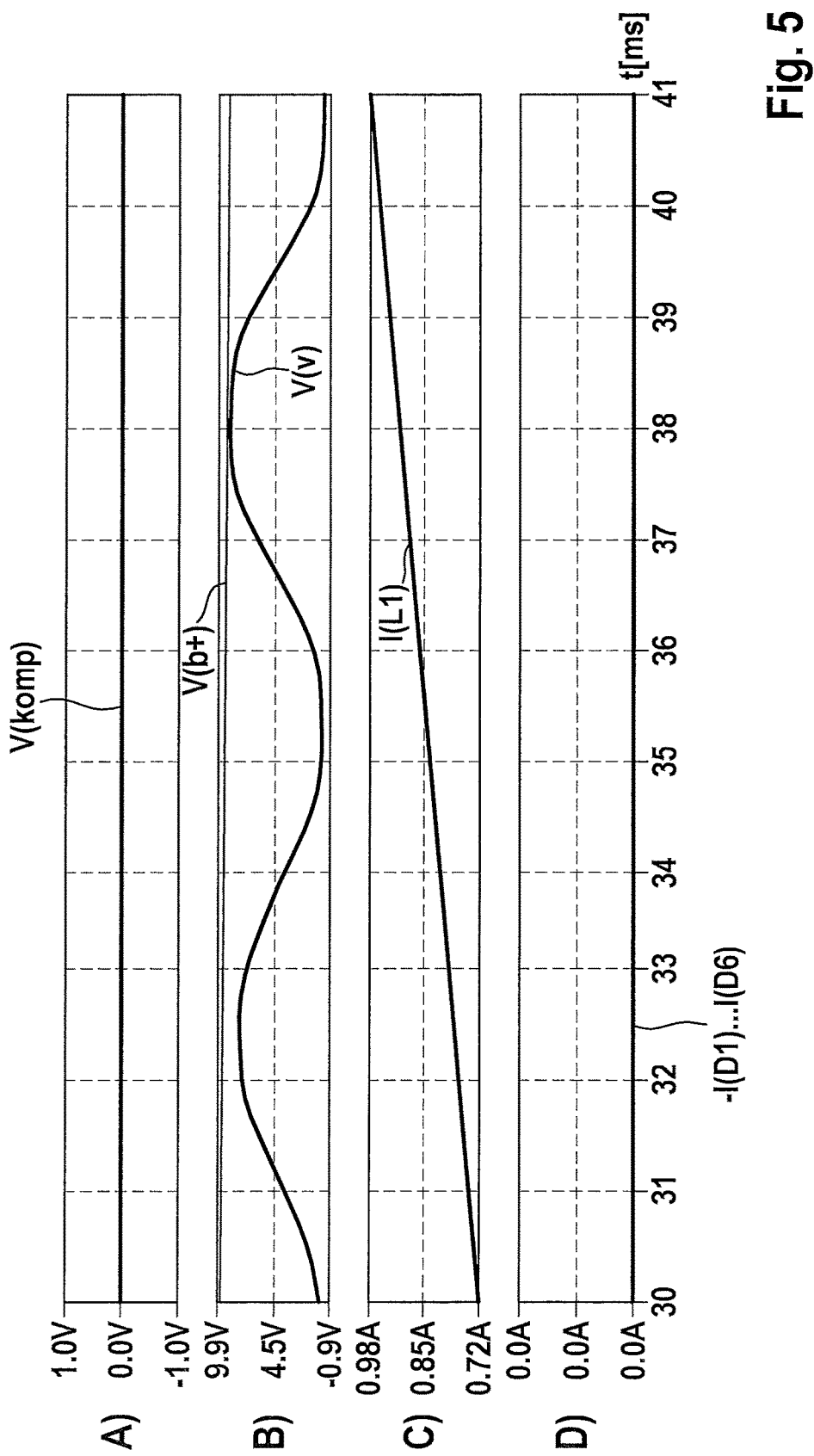
FIG. 5 shows signal profiles of currents and voltages in the context of a generator assemblage having a generator with little or no excitation.

FIG. 5 shows corresponding signal profiles of currents and voltages in the context of a generator assemblage having a generator 10 with little or no excitation. Diagrams A to D correspond to diagrams A to D of FIG. 4. Generator 10 here has a delivered current of 0 A. It is apparent that the comparator signal V(komp) never responds; the voltage V(v) moves in free-floating fashion in a range between the voltage V(b+) and 0 V (voltage of the grounded negative DC-voltage-side terminal B−). The voltage V(v) is not sufficient, however, for a respective current flow −I(D3) or I(D4).

Figure 6:
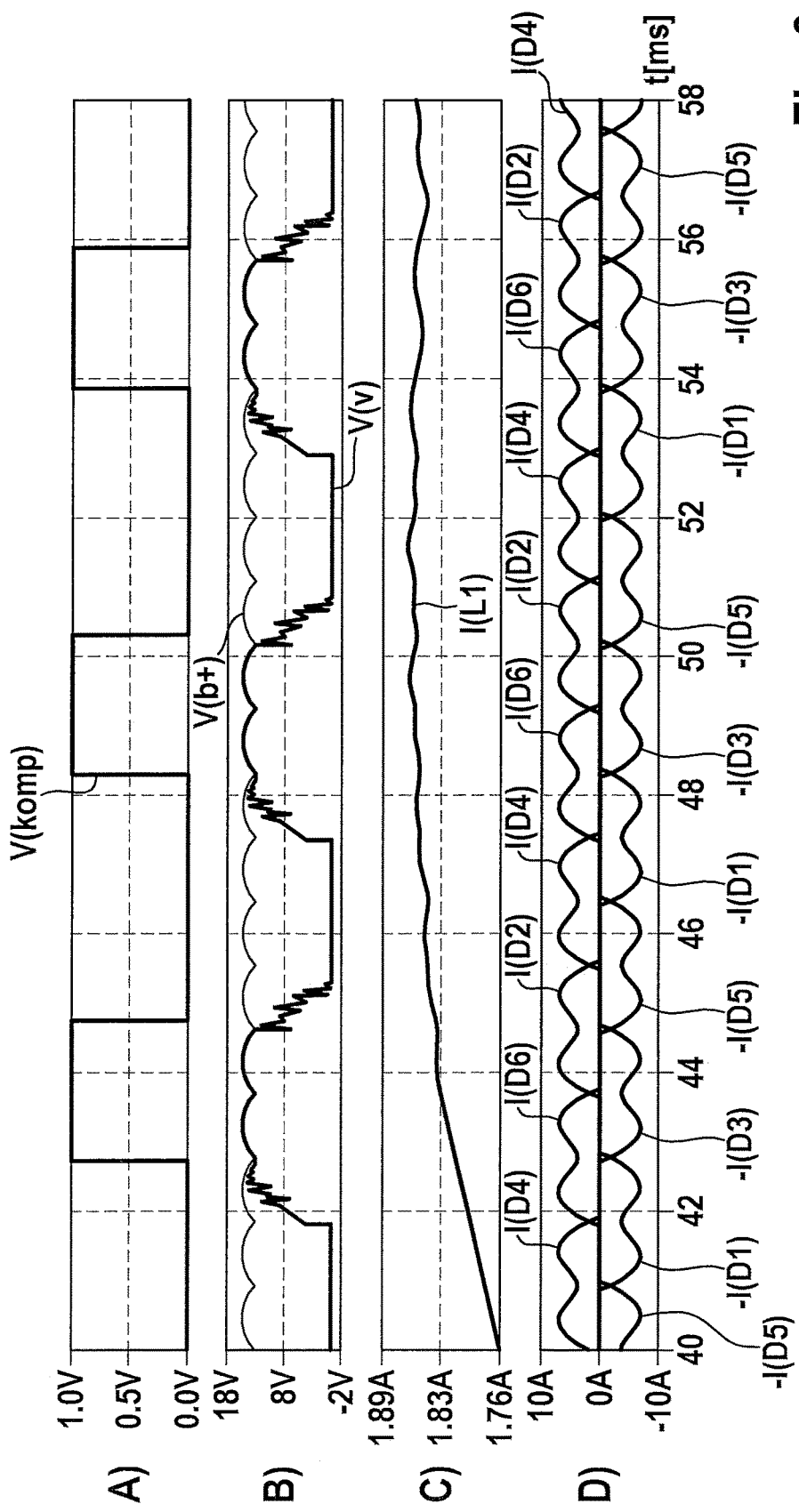
FIG. 6 shows signal profiles of currents and voltages in the context of a generator assemblage having a partly excited generator.

FIG. 6 shows signal profiles of currents and voltages in the context of a generator assemblage 1 having a partly excited electrical machine. Diagrams A to D correspond to diagrams A to D of FIGS. 4 and 5.

The comparator signal V(komp) does respond, but the time during which it responds is appreciably less than 50% of the total time. The voltage V(v) requires a perceptible amount of time to rise from 1 V to V(b+). In this intermediate time a break occurs in which no current is flowing through the corresponding phase branch. This corresponds to the break between I(D4) and −I(D3) in diagram D. The voltage V(v) must therefore first exceed the voltage V(b+) before the corresponding current −I(D3) can flow in the first direction through rectifier element D3 into the vehicle electrical system. Conversely, the voltage V(v) must first fall below the voltage V(b−) (here, 0 V) before the current −I(D4) can flow in the second direction through rectifier element D4 into generator 10.

All in all, it is apparent that the time proportion (referred to here as the "current conduction time proportion") during which a respective current −I(D1), I(D2), −I(D3), I(D4), −I(D5), and I(D6) is flowing through rectifier elements D1 to D6, and the corresponding duration of current conduction (referred to here as the "current conduction duration"), rises with increasing excitation current and ends up at a 50% current conduction time proportion. The effect occurs in particular at low rotation speeds. The profile of the no-load voltage of a generator 10 can consequently be characterized by way of the current conduction time proportion at a fixed rotation speed with a varying excitation current.

Figure 7:
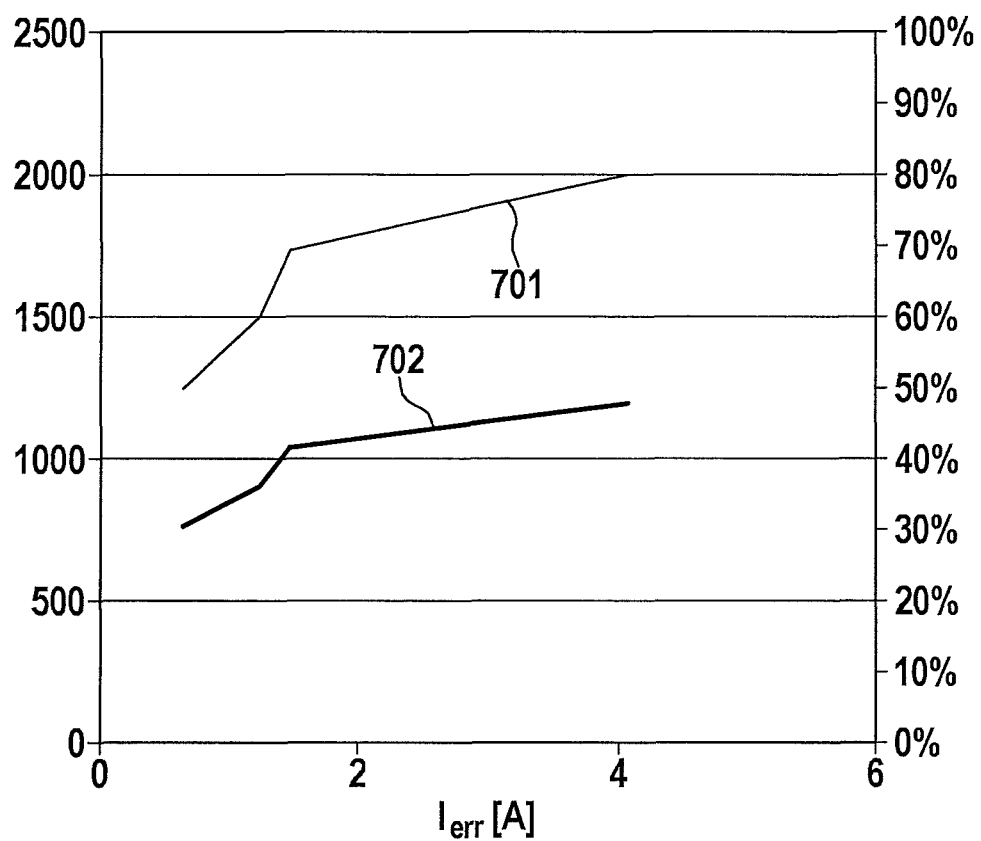
FIG. 7 shows a relationship between an excitation current and parameters of a rectifier element of an intact generator assemblage.

Plotting the current conduction time proportion (or current conduction duration) against excitation current thus yields a depiction corresponding to FIG. 7. FIG. 7 shows a relationship between an excitation current Ierr (in A) on the X axis, and respectively the current conduction duration (in µs) on the left Y axis and current conduction time proportion (in %) on the right Y axis, as parameters of a rectifier element of an intact generator assemblage.

The characteristic curve 701 corresponds to the current conduction duration, and characteristic curve 702 to the current conduction time proportion. It is noteworthy that these characteristic curves are dependent on the vehicle electrical system voltage (e.g. voltage B+), since the latter must first be exceeded by the corresponding voltages V(u), V(v), and V(w). The kink in the characteristic curves is observed specifically in the context of five-phase generator assemblages. In five-phase generators, a kink occurs in the phase voltage curve. The current conduction duration experiences a discontinuity as this kink is exceeded toward B+ or B−.

The invention now provides for acquiring one or more characteristic curves similar to characteristic curves 701 and 702 in FIG. 7. This can occur, for example, at the factory, but in any case in the context of a generator assemblage 1 that is known to be intact. The instantaneous vehicle electrical system voltage, which may be the control voltage, is taken into account here. The one or more characteristic curves thus indicate expected values for the current conduction duration or current conduction time proportion for at least two excitation current values (Ierr) in the context of an intact generator assemblage 1. Derived parameters that correspond to the current conduction time proportion can also be used. The one or more characteristic curves can be stored in the nonvolatile memory of generator regulator 20.

During operation, in the context of a constant rotation speed of generator 10, the instantaneous generator values can be checked by slowly elevating the excitation current at a constant rotation speed (ideally in a no-load situation). In the event of a large deviation from the expected values derived from the characteristic curve(s), a fault reaction (e.g. setting a fault bit, emergency mode function at reduced output, or shutoff of generator 10) can be initiated.

Figure 8:
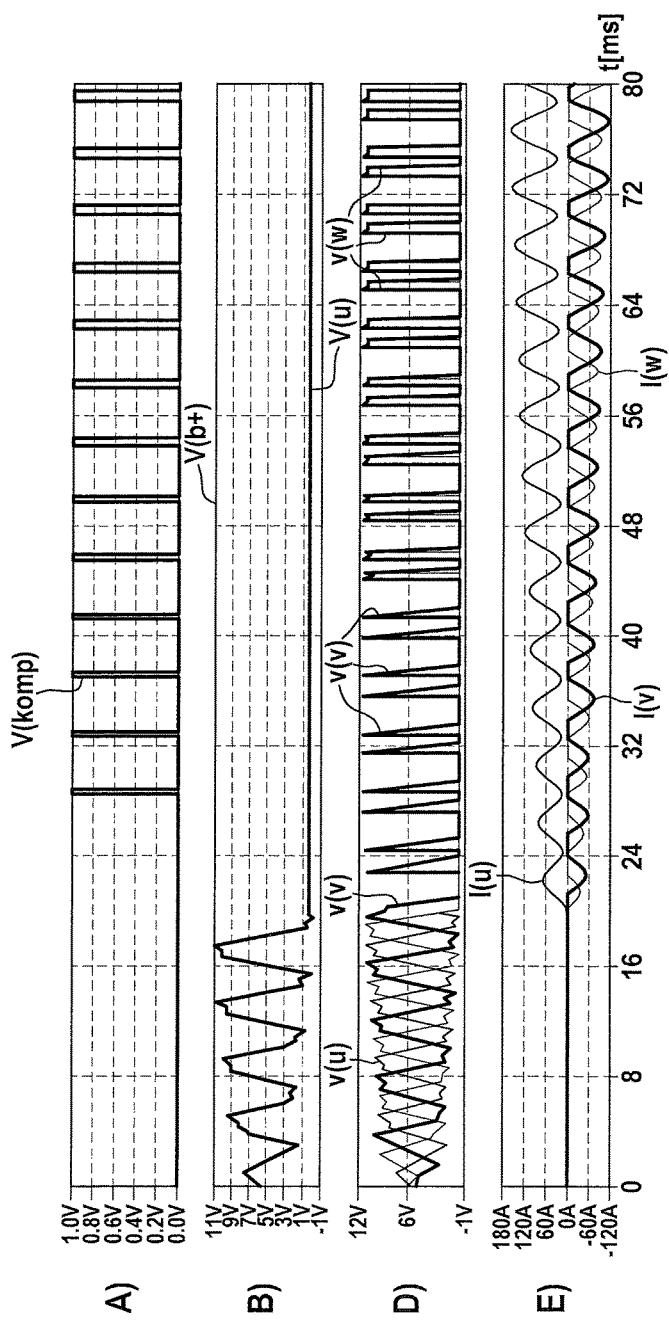
FIG. 8 illustrates the identification of electrical faults according to an embodiment of the invention.

FIG. 8 illustrates the identification of electrical faults, in accordance with an embodiment of the invention, on the basis of the system behavior in the context of a short circuit of a rectifier branch. Diagrams A, B, and D correspond here to diagrams A, B, and D of FIGS. 4 to 6. Diagram E additionally depicts the voltages V(u), V(v), and V(w) present at all the AC-voltage-side terminals U, V, and W.

At t=20 ms a short circuit occurs in the phase branch having the AC-voltage-side terminal U, so that a voltage signal V(u) is no longer present at it (diagram B). This results in an appreciable asymmetry in the currents I(U), I(V), and I(W) (diagram D). As a result of the elevated current I(U) due to the short circuit, although the comparator signal V(komp) becomes activated already at lower excitation currents, it will never reach a current conduction time proportion of 50% or almost 50%. A large portion of the current generated in generator 10 becomes short-circuited. The current conduction time proportion of 50% thus cannot be generated anywhere, no matter what the phase.

What is claimed is:

1. A method for identifying an electrical fault in a generator that includes a regulator and a rectifier having rectifier elements, the method comprising:
    ascertaining at least one parameter indicating a proportion of time during which a current is flowing through at least one of the rectifier elements; and
    determining that an electrical fault exists if the at least one parameter deviates by more than a predetermined amount from an expected value, wherein the expected value is derived from a characteristic curve that indicates values for the at least one parameter as a function of excitation current values of an excitation winding of the generator, the parameter values indicating those of a faultless generator.

2. The method of claim 1, wherein the characteristic curve indicates the values for the at least one parameter at a predetermined rotation speed of the generator or at a predetermined voltage drop between DC-voltage-side terminals of the rectifier.

3. The method of claim 1, wherein the method is performed at a constant rotation speed of the generator.

4. The method of claim 1, wherein the electrical fault exists if the at least one parameter indicates that the proportion of time during which the current is flowing through the at least one of the rectifier elements is, at a maximum excitation current, appreciably above or below 50%.

5. The method of claim 1, wherein the at least one parameter is ascertained by evaluating at least one AC voltage present at an AC-voltage-side terminal of the rectifier, and at least one DC voltage present at a DC-voltage-side terminal of the rectifier.

6. The method of claim 5, wherein the at least one parameter is ascertained based on a comparator-based comparison of the at least one AC voltage with the at least one DC voltage.

7. A regulator of a generator, the regulator comprising:
a rectifier having rectifier elements;
a comparator to compare at least one AC voltage present at at least one AC-voltage-side terminal of the rectifier with at least one DC voltage present at a DC-voltage-side terminal of the rectifier; and
a computation unit, wherein the computation unit is configured to:
  determine at least one parameter that indicates a proportion of time during which a current is flowing through at least one of the rectifier elements; and
  determine that an electrical fault exists if the at least one parameter deviates by more than a predetermined amount—from an expected value, wherein the expected value is derived from a characteristic curve that indicates values for the at least one parameter as a function of excitation current values of an excitation winding of the generator, the parameter values indicating those of a faultless generator.

8. A non-transitory computer readable medium on which is stored a computer program, which is executable by a processor and which, when executed by the processor, causes the processor to perform a method for identifying an electrical fault in a generator, the generator including a regulator and a rectifier having rectifier elements, the method comprising:
ascertaining at least one parameter indicating a proportion of time during which a current is flowing through at least one of the rectifier elements; and
determining that an electrical fault exists if the at least one parameter deviates by more than a predetermined amount from an expected value, wherein the expected value is derived from a characteristic curve that indicates values for the at least one parameter as a function of excitation current values of an excitation winding of the generator, the parameter values indicating those of a faultless generator.

9. The non-transitory computer readable medium of claim 8, wherein the expected value is derived from a characteristic curve that indicates values for the at least one parameter as a function of excitation current values of an excitation winding of the generator, the parameter values indicating those of a faultless generator.

10. The method of claim 1, wherein the generator is of a motor vehicle.

11. The method of claim 1, wherein the electrical fault exists if the at least one parameter indicates that the proportion of time during which the current is flowing through the at least one of the rectifier elements is, at a maximum excitation current, equal to less than 45%.

12. The method of claim 1, wherein the electrical fault exists if the at least one parameter indicates that the proportion of time during which the current is flowing through the at least one of the rectifier elements is, at a maximum excitation current, equal to or more than 55%.

* * * * *